(12) United States Patent
Scheiper et al.

(10) Patent No.: US 8,790,973 B2
(45) Date of Patent: Jul. 29, 2014

(54) WORKFUNCTION METAL STACKS FOR A FINAL METAL GATE

(75) Inventors: Thilo Scheiper, Dresden (DE); Jan Hoentschel, Dresden (DE)

(73) Assignee: GlobalFoundries Inc., Grand Cayman (KY)

( * ) Notice: Subject to any disclaimer, the term of this patent is extended or adjusted under 35 U.S.C. 154(b) by 0 days.

(21) Appl. No.: 13/445,475

(22) Filed: Apr. 12, 2012

(65) Prior Publication Data
US 2013/0270645 A1  Oct. 17, 2013

(51) Int. Cl.
*H01L 21/8238* (2006.01)

(52) U.S. Cl.
USPC ..... 438/199; 438/275; 438/592; 257/E21.623

(58) Field of Classification Search
CPC ............... H01L 21/823842; H01L 21/28079; H01L 21/28088
USPC .......... 438/199, 275, 283, 592; 257/E21.409, 257/E21.623
See application file for complete search history.

(56) References Cited

U.S. PATENT DOCUMENTS

| | | | | |
|---|---|---|---|---|
| 7,598,545 | B2 * | 10/2009 | Cartier et al. | 257/251 |
| 8,232,154 | B2 * | 7/2012 | Chien et al. | 438/199 |
| 8,373,199 | B2 * | 2/2013 | Ng et al. | 257/192 |
| 2006/0289920 | A1 * | 12/2006 | Wu et al. | 257/310 |
| 2007/0164367 | A1 * | 7/2007 | Forbes et al. | 257/369 |
| 2007/0178634 | A1 * | 8/2007 | Jung et al. | 438/199 |
| 2009/0294867 | A1 * | 12/2009 | Lee et al. | 257/369 |
| 2010/0219481 | A1 * | 9/2010 | Tseng et al. | 257/369 |
| 2011/0284966 | A1 * | 11/2011 | Wen et al. | 257/368 |
| 2012/0184096 | A1 * | 7/2012 | Koyama et al. | 438/592 |
| 2013/0119485 | A1 * | 5/2013 | Masuoka et al. | 257/410 |

* cited by examiner

*Primary Examiner* — Tuan N. Quach
(74) *Attorney, Agent, or Firm* — Ditthavong & Steiner, P.C.

(57) ABSTRACT

Transistor devices are formed with a pMOS and an nMOS workfunction stack of substantially equal thickness after gate patterning. Embodiments include forming n-type and p-type areas in a substrate, forming a pMOS workfunction metal stack layer on both areas, forming a hardmask layer on the pMOS workfunction metal stack layer on the n-type area, removing the pMOS workfunction metal stack layer from the p-type area, forming an nMOS workfunction metal stack layer on the p-type area and on the hardmask layer, and removing the nMOS workfunction metal stack layer from the hardmask layer.

15 Claims, 8 Drawing Sheets

WORKFUNCTION METAL STACKS FOR A FINAL METAL GATE

TECHNICAL FIELD

The present disclosure relates to the fabrication of semiconductor devices using a workfunction metal stack as a final metal gate. The present disclosure is particularly applicable to high-K metal gate (HKMG) gate first technology.

BACKGROUND

In HKMG gate first technologies, the final metal gate topology, particularly, the thickness of a negative channel field effect transistor (nMOS) work function metal stack and of a positive channel field effect transistor (pMOS) work function metal stack are critical for gate etching and manufacturing. However, nMOS and pMOS workfunction thickness is difficult to control through various fabrication processes. A final metal gate topology is conventionally formed by forming an n-type area and a p-type area in a substrate, forming a pMOS workfunction metal stack layer over both areas, removing the pMOS work workfunction metal stack over the p-type area, and forming an nMOS workfunction metal stack layer over both areas. The resulting nMOS and pMOS gates have different thicknesses, which is unsuitable for gate etching and manufacturing.

Efforts have been made to flatten the final metal stack topology by removing the nMOS and pMOS workfunction metal stacks after a drive in anneal and depositing a final metal stack without workfunction metals. However, the process delivers less workfunction setting, resulting in an inferior final metal gate.

A need therefore exists for methodology enabling formation of a final metal stack including workfunction metals with a topology suitable for gate etching and manufacturing.

SUMMARY

An aspect of the present disclosure is a method of fabricating a semiconductor device using HKMG gate first technology by protecting the pMOS workfunction stack with a hardmask during deposition and removal of the nMOS workfunction stack from the pMOS workfunction stack.

Another aspect of the present disclosure is a device with a pMOS and an nMOS workfunction stack of substantially equal thickness after gate patterning.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method of fabricating a semiconductor device, the method comprising: forming an n-type area and a p-type area in a substrate; forming a pMOS workfunction metal stack layer on the n-type area and the p-type area; forming a hardmask layer on the pMOS workfunction metal stack layer on the n-type area; removing the pMOS workfunction metal stack layer from the p-type area; forming an nMOS workfunction metal stack layer on the p-type area and on the hardmask layer; and removing the nMOS workfunction metal stack layer from the hardmask layer.

Aspects of the present disclosure include: removing the hardmask layer after removing the nMOS workfunction metal stack layer from the hardmask layer; forming a polycrystalline silicon (poly-Si) or an amorphous silicon (a-Si) layer on the pMOS workfunction metal stack layer and on the nMOS workfunction metal stack layer; and patterning the pMOS workfunction metal stack layer and overlying poly-Si or a-Si layer to form a pMOS gate electrode, and patterning the nMOS workfunction metal stack layer and overlying poly-Si or a-Si layer to form an nMOS gate electrode. Another aspect includes forming the poly-Si or the a-Si to a thickness of 550 angstroms (Å) to 650 Å. Other aspects include: forming a shallow trench isolation (STI) region between the n-type area and the p-type area; forming a channel silicon germanium (cSiGe) layer in the n-type area of the substrate; and forming a high-k dielectric layer over the n-type and p-type areas prior to forming the pMOS workfunction metal stack layer. Additional aspects include annealing the pMOS and nMOS workfunction metal stack layers at a temperature of 800° C. to 950° C. subsequent to removing the hardmask layer. Further aspects include forming the pMOS workfunction metal stack layer by: forming a first layer of titanium nitride (TiN) to a thickness of 2 Å to 10 Å; forming a layer of aluminum (Al) to a thickness of 2 Å to 8 Å; and forming a second layer of TiN to a thickness of 15 Å to 25 Å. Other aspects include forming the nMOS workfunction metal stack layer by: forming a layer of lanthanum (La) to a thickness of 2 Å to 10 Å; and forming a layer of TiN to a thickness of 15 Å to 25 Å. Additional aspects include forming the hardmask layer by: forming a layer of silicon nitride (SiN) over the p-type area and the n-type area; and removing the SiN from the p-type area by: forming a resist over the n-type area, and dry etching the SiN. Another aspect includes forming the hardmask layer by: forming a layer of silicon dioxide ($SiO_2$) over the p-type are and the n-type area; and removing the $SiO_2$ from the p-type area by: forming a resist over the n-type area, and etching the $SiO_2$ with hydrofluoric acid (HF). Other aspects include removing the nMOS workfunction metal stack layer from the n-type area by: forming a resist on the p-type area; and wet etching. Additional aspects include removing the pMOS workfunction metal stack layer from the p-type area by: forming a resist on the n-type area; and wet etching.

Another aspect of the present disclosure is a device including a substrate having a p-type area and an n-type area; a pMOS workfunction metal stack layer over the n-type area, the pMOS workfunction metal stack layer having a first thickness; and an nMOS workfunction metal stack layer over the p-type area, the nMOS workfunction metal stack layer having a second thickness substantially equal to the first thickness.

Aspects include a high-k dielectric layer on the substrate beneath the nMOS and pMOS workfunction metal stack layers. Further aspects include a poly-Si or an a-Si layer on the pMOS and nMOS workfunction metal stack layers having a thickness of 550 Å to 650 Å. Another aspect includes a pMOS workfunction metal stack layer including: a first layer of TiN having a thickness of 2 Å to 10 Å; a layer of Al having a thickness of 2 Å to 8 Å; and a second layer of TiN having a thickness of 15 Å to 25 Å. Additional aspects include an nMOS workfunction metal stack layer including: a layer of La having a thickness of 2 Å to 10 Å; and a layer of TiN with a thickness of 15 Å to 25 Å.

Another aspect of the present disclosure is a method including: forming an n-type area and a p-type area in a substrate separated by a STI region; forming a cSiGe layer in the n-type area; forming a high-k dielectric layer over the p-type area, the STI region, and the cSiGe layer; forming a pMOS workfunction metal stack layer on the high-k dielectric layer; forming a hardmask layer on the pMOS workfunction metal stack layer; removing a portion of the hardmask layer positioned over the p-type area, exposing a portion of the pMOS workfunction metal stack layer; removing the exposed portion of the pMOS workfunction metal stack layer, exposing a portion of the high-k dielectric layer; forming an nMOS workfunction metal stack layer on the exposed portion of the high-k dielectric layer and on a remaining portion of the hardmask layer; removing a portion of the nMOS workfunction metal stack layer positioned on the remaining portion of the hardmask layer; removing the remaining portion of the hardmask layer; forming a poly-Si or an a-Si layer on a remaining portion of the pMOS workfunction metal stack layer and on a remaining portion of the nMOS workfunction metal stack layer; and patterning the remaining portion of the nMOS workfunction metal stack layer and the overlying poly-Si or a-Si layer and the remaining portion of the pMOS workfunction metal stack layer and the overlying poly-Si or a-Si layer to form an nMOS gate electrode and a pMOS gate electrode, respectively.

Aspects include forming the pMOS workfunction by: forming a first layer of TiN; forming a layer of Al; and forming a second layer of TiN. Further aspects include forming the nMOS workfunction metal stack layer by: forming a layer of La; and forming a layer of TiN. Other aspects include forming the hardmask layer by forming a layer of SiN or $SiO_2$.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which.

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the current problem of nMOS and pMOS workfunction formation and an uneven final metal stack topology attendant upon HKMG gate first technologies. In accordance with embodiments of the present disclosure, a hardmask is formed over the pMOS workfunction metal gate stack on an n-type area of the substrate to protect the pMOS workfunction metal gate stack when an nMOS workfunction metal stack is formed over the whole substrate and is removed from the pMOS workfunction metal gate stack. The final metal stack topology includes a pMOS workfunction and an nMOS workfunction with substantially equal thicknesses, resulting in an excellent workfunction setting and a high manufacturability.

Methodology in accordance with embodiments of the present disclosure includes forming an n-type area and a p-type area in a substrate, forming a pMOS workfunction metal stack layer on the n-type area and the p-type area, forming a hardmask layer on the pMOS workfunction metal stack layer on the n-type area, removing the pMOS workfunction metal stack layer from the p-type area, forming an nMOS workfunction metal stack layer on the p-type area and on the hardmask layer, and removing the nMOS workfunction metal stack layer from the hardmask layer.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

Figure 1:
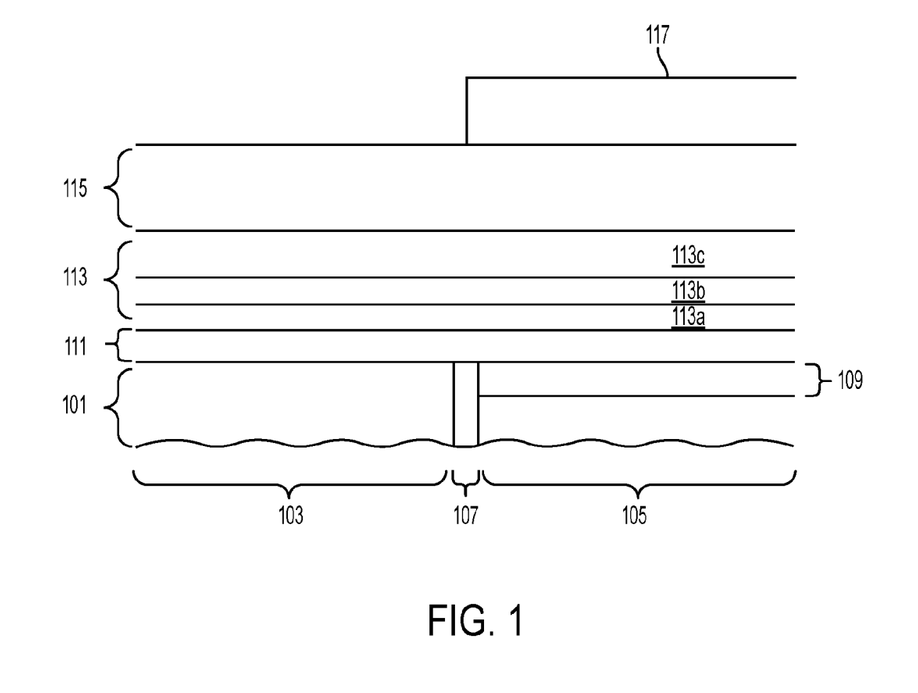
FIGS. 1 through 8 schematically illustrate sequential steps of a method in accordance with an exemplary embodiment.

Adverting to FIG. 1, in accordance with an exemplary embodiment, a substrate 101 is formed with a p-type area 103 and an n-type area 105 separated by an STI region 107. The substrate 101 includes a c-SiGe layer 109 in the top surface of the n-type area 105 and a high-k dielectric layer 111 such as, for example, hafnium silicon oxynitride (HfSiON), hafnium oxide ($HfO_2$), yttrium oxide ($Y2O_3$), zirconium oxide ($ZrO_2$), barium zirconium oxide ($BaZrO_3$), or tantalum oxide ($Ta_2O_5$). Then, a pMOS workfunction metal stack layer 113 is formed, for example, with a first layer 113a of TiN having a thickness of 2 Å to 10 Å (e.g., 5 Å), a layer 113b of Al having a thickness of 2 Å to 8 Å, and a second layer 113c of TiN having a thickness of 15 Å to 25 Å (e.g., 20 Å). Next, a hardmask 115 is formed on the pMOS workfunction metal stack layer 113. The hardmask 115 may be formed, for example, of SiN or $SiO_2$. Additionally, a resist layer 117 is formed on the hardmask 115 over the n-type area 105.

Figure 2:
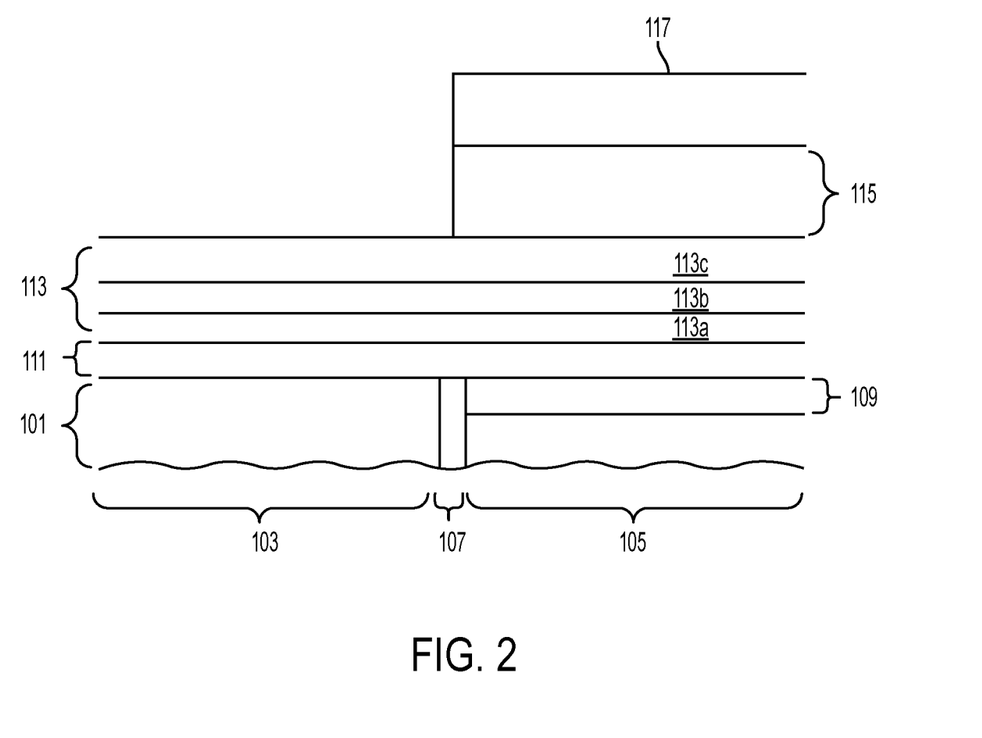

Adverting to FIG. 2 the hardmask 115 is removed from the p-type area 103, e.g. by etching, for example, by applying HF for a $SiO_2$ hardmask or by dry etching for a SiN hardmask.

Figure 3:
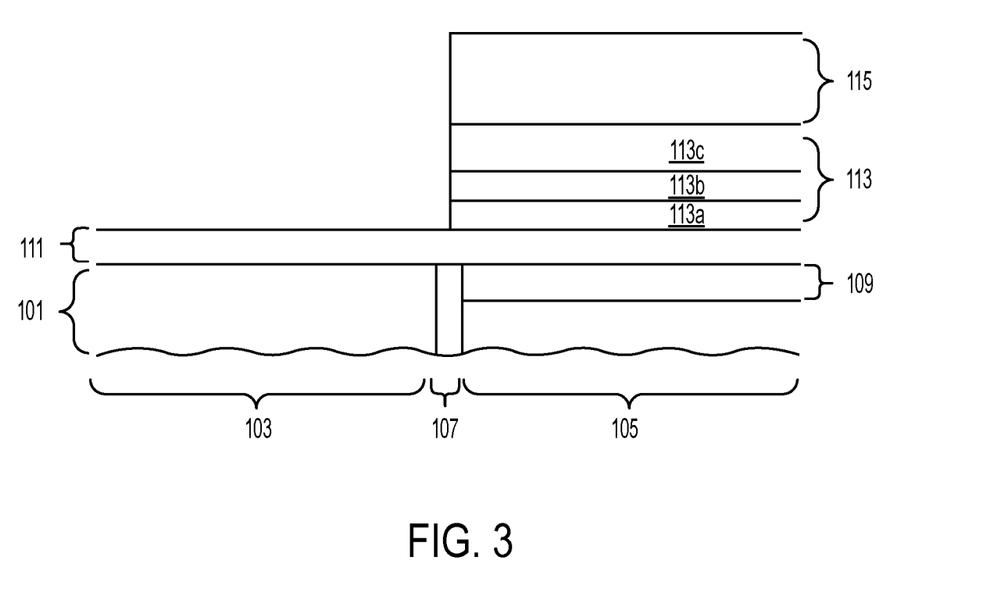

As illustrated in FIG. 3, the resist 117 is removed and the pMOS workfunction metal stack layer 113 is removed from the p-type area 103 using the hardmask 115 as a mask. For example, the pMOS workfunction metal stack layer 113 may be removed from the p-type area 103 by wet etching with a mixture of sulfuric acid and hydrogen peroxide (SPM) and/or a mixture of ammonia and peroxide (APM).

Figure 4:
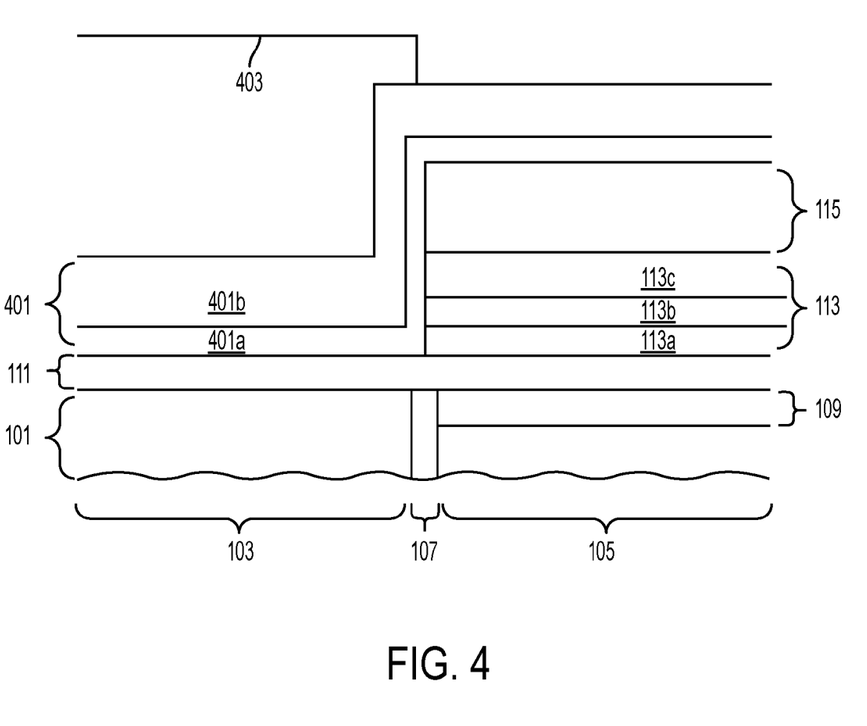

Adverting to FIG. 4, an nMOS workfunction metal stack layer 401 is formed over the entire substrate, followed by a resist 403 over the p-type area 103. The nMOS workfunction metal stack layer 401 is formed with a layer 401a of La having a thickness of 2 Å to 10 Å (e.g., 4 Å), and a layer 401b of TiN having a thickness of 15 Å to 25 Å (e.g., 20 Å).

Figure 5:
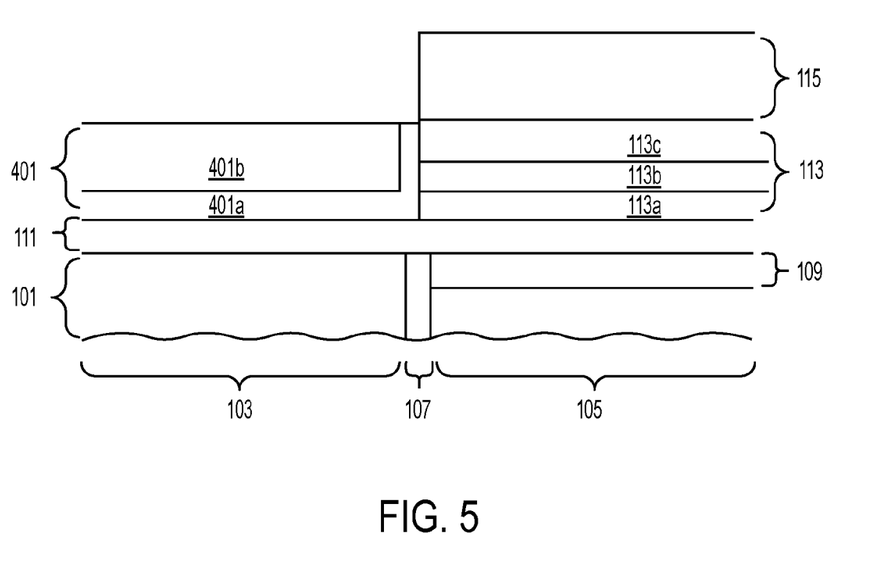

As illustrated in FIG. 5, the nMOS workfunction metal stack layer 401 is removed from the n-type area 105, for example using an SPM/APM wet etch. Then the resist 403 is stripped from the p-type area 103.

Figure 6:
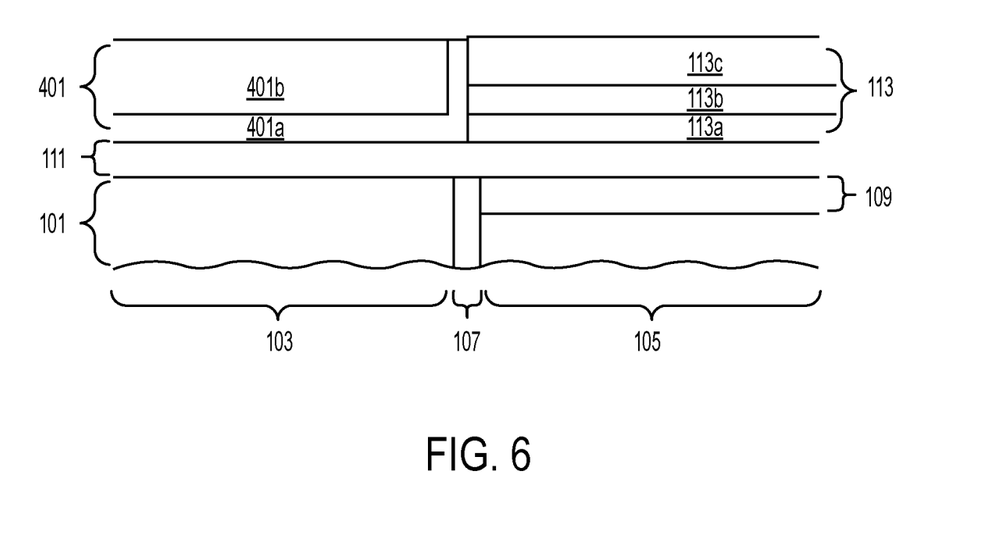

As illustrated in FIG. 6, the hardmask 115 is removed from the n-type area 105. The hardmask 115 is removed, for example by applying HF for a $SiO_2$ hardmask or by dry etching for a SiN hardmask. Once the hardmask 115 is removed, the substrate 101, the high-k dielectric layer 111, the nMOS workfunction metal stack layer 401 and the pMOS workfunction metal stack layer 113 are thermally annealed at a temperature of 800° C. to 950° C. (e.g. 900° C.) for a short period of time (e.g., 30 seconds).

Figure 7:
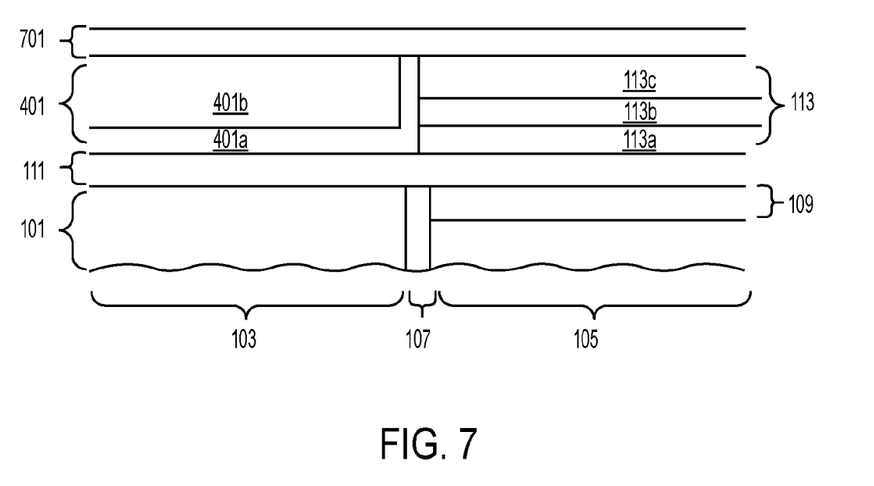

Adverting to FIG. 7, a poly-Si or a-Si layer 701 is formed on the nMOS workfunction metal stack layer 401 and the pMOS workfunction metal stack layer 113. The poly-Si or a-Si may be formed to a thickness of 550 Å to 650 Å.

Figure 8:
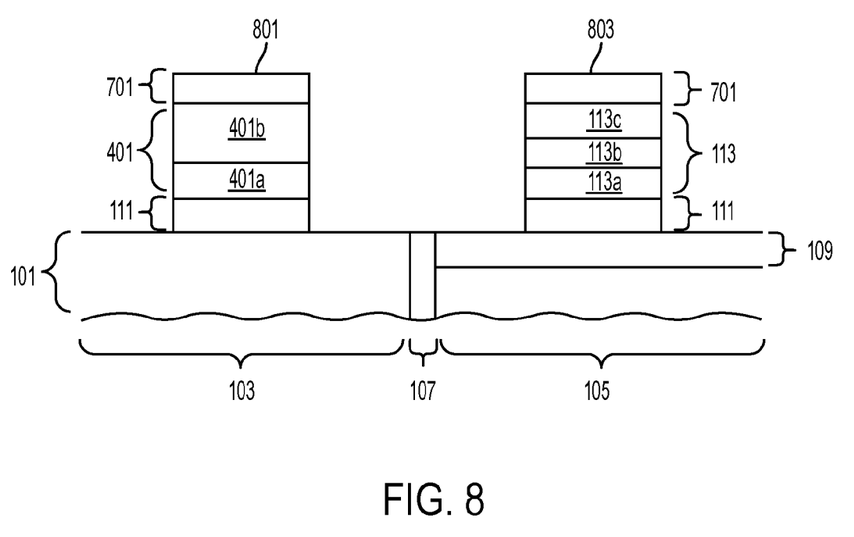

As illustrated in FIG. 8, a portion of the layer 701, the nMOS workfunction metal stack layer 401, and the high-k dielectric layer 111 are patterned to form an nMOS gate electrode 801 and a portion of the layer 701, the pMOS workfunction metal stack layer 113, and the high-k dielectric layer 111 are patterned to form a pMOS gate electrode 803.

The embodiments of the present disclosure can achieve several technical effects, including metal stack topology with a pMOS workfunction stack and an nMOS workfunction stack of substantially equal thicknesses, resulting in excellent workfunction setting and a high manufacturability. The present disclosure enjoys industrial applicability in any of various types of highly integrated semiconductor devices, particularly HKMG gate first technologies.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A method comprising:
   forming an n-type area and a p-type area in a substrate;
   forming a high-k dielectric layer over the n-type and p-type areas;
   forming a pMOS workfunction metal stack layer on the high-k dielectric layer;
   forming a hardmask layer on the pMOS workfunction metal stack layer on the n-type area;
   removing the pMOS workfunction metal stack layer from the p-type area, exposing a portion of the high-k dielectric layer, wherein the portion extends over the p-type area;
   forming an nMOS workfunction metal stack layer on the exposed portion of the high-k dielectric layer and on the hardmask layer; and
   removing the nMOS workfunction metal stack layer from the hardmask layer.

2. The method according to claim 1, further comprising:
   removing the hardmask layer after removing the nMOS workfunction metal stack layer from the hardmask layer;
   forming a polycrystalline silicon (poly-Si) or an amorphous silicon (a-Si) layer on the pMOS workfunction metal stack layer and on the nMOS workfunction metal stack layer; and
   patterning the pMOS workfunction metal stack layer and the overlying poly-Si or a-Si layer to form a pMOS gate electrode, and patterning the nMOS workfunction metal stack layer and the overlying poly-Si or a-Si layer to form an nMOS gate electrode.

3. The method according to claim 2, comprising forming the poly-Si or the a-Si to a thickness of 550 angstroms (A) to 650 A.

4. The method according to claim 1, further comprising:
   forming a shallow trench isolation (STI) region between the n-type area and the p-type area;
   forming a channel silicon germanium (cSiGe) layer in the n-type area of the substrate; and
   forming a high-k dielectric layer over the n-type and p-type areas prior to forming the pMOS workfunction metal stack layer.

5. The method according to claim 1, comprising annealing the pMOS and nMOS workfunction metal stack layers at a temperature of 800° C. to 950° C. subsequent to removing the hardmask layer.

6. The method according to claim 1, comprising forming the pMOS workfunction metal stack layer by:
   forming a first layer of titanium nitride (TiN) to a thickness of 2 A to 10 A;
   forming a layer of aluminum (Al) to a thickness of 2 A to 8 A; and
   forming a second layer of TiN to a thickness of 15 A to 25 A.

7. The method according to claim 6, comprising forming the nMOS workfunction metal stack layer by:
   forming a layer of lanthanum (La) to a thickness of 2 A to 10 A; and
   forming a layer of TiN to a thickness of 15 A to 25 A.

8. The method according to claim 1, comprising forming the hardmask layer by:
   forming a layer of silicon nitride (SiN) over the p-type area and the n-type area; and removing the SiN from the p-type area by:
   forming a resist over the n-type area; and
   dry etching the SiN.

9. The method according to claim 1, comprising forming the hardmask layer by:
   forming a layer of silicon dioxide (SiO2) over the p-type area and the n-type area; and removing the SiO2 from the p-type area by:
   forming a resist over the n-type area; and
   etching the SiO2 with hydrofluoric acid (HF).

10. The method according to claim 1, comprising removing the nMOS workfunction metal stack layer from the n-type area by:
    forming a resist on the p-type area; and
    wet etching.

11. The method according to claim 1, comprising removing the pMOS workfunction metal stack layer from the p-type area by:
    forming a resist on the n-type area; and
    wet etching.

12. A method comprising:
    forming an n-type area and a p-type area in a substrate separated by a shallow trench isolation (STI) region;
    forming a channel silicon germanium (cSiGe) layer in the n-type area;
    forming a high-k dielectric layer over the p-type area, the STI region, and the cSiGe layer;
    forming a pMOS workfunction metal stack layer on the high-k dielectric layer;
    forming a hardmask layer on the pMOS workfunction metal stack layer;
    removing a portion of the hardmask layer positioned over the p-type area, exposing a portion of the pMOS workfunction metal stack layer;

removing the exposed portion of the pMOS workfunction metal stack layer, exposing a portion of the high-k dielectric layer;

forming an nMOS workfunction metal stack layer on the exposed portion of the high-k dielectric layer and on a remaining portion of the hardmask layer;

removing a portion of the nMOS workfunction metal stack layer positioned on the remaining portion of the hardmask layer;

removing the remaining portion of the hardmask layer;

forming a polysilicon (poly-Si) or an amorphous silicon (a-Si) layer on a remaining portion of the pMOS workfunction metal stack layer and on a remaining portion of the nMOS workfunction metal stack layer; and patterning the remaining portion of the nMOS workfunction metal stack layer and the overlying poly-Si or a-Si layer and the remaining portion of the pMOS workfunction metal stack layer and the overlying poly-Si or a-Si layer to form an nMOS gate electrode and a pMOS gate electrode, respectively.

13. The method according to claim 12, comprising forming the pMOS workfunction by: forming a first layer of titanium nitride (TiN);

forming a layer of aluminum (Al); and forming a second layer of TiN.

14. The method according to claim 12, comprising forming the nMOS workfunction metal stack layer by:

forming a layer of lanthanum (La); and forming a layer of TiN.

15. The method according to claim 12, comprising forming the hardmask layer by forming a layer of silicon nitride (SiN) or silicon dioxide (SiO2).

\* \* \* \* \*